United States Patent [19]

Maeda et al.

[11] Patent Number: 5,800,877
[45] Date of Patent: Sep. 1, 1998

[54] METHOD FOR FORMING A FLUORINE CONTAINING SILICON OXIDE FILM

[75] Inventors: Kazuo Maeda; Noboru Tokumasu, both of Tokyo; Yoshiaki Yuyama, Fussa, all of Japan

[73] Assignees: Canon Sales Co., Inc.; Semiconductor Process Laboratory Co., Ltd., both of Japan

[21] Appl. No.: 694,660

[22] Filed: Aug. 9, 1996

[30] Foreign Application Priority Data

Aug. 18, 1996 [JP] Japan ................... 7-210896

[51] Int. Cl.$^6$ .................. C23C 16/42; H05H 1/00
[52] U.S. Cl. .................. 427/535; 427/539; 427/255.1; 427/255.3
[58] Field of Search ............... 427/255.1, 255.3, 427/535, 533, 574, 539

[56] References Cited

U.S. PATENT DOCUMENTS

| | | | |
|---|---|---|---|
| 4,737,379 | 4/1988 | Hudgens et al. | 427/575 |
| 5,288,518 | 2/1994 | Homma | 427/255.1 |
| 5,314,724 | 5/1994 | Tsukune et al. | 427/535 |
| 5,420,075 | 5/1995 | Homma et al. | 437/195 |
| 5,429,995 | 7/1995 | Nishiyama et al. | |

FOREIGN PATENT DOCUMENTS

| | | |
|---|---|---|
| 517548 | 12/1992 | European Pat. Off. . |
| 572704 | 12/1993 | European Pat. Off. . |
| 654545 | 5/1995 | European Pat. Off. . |
| 4-167431 | 6/1992 | Japan . |
| 5-226480 | 9/1993 | Japan . |
| 7-50295 | 2/1995 | Japan . |
| 7-161705 | 6/1995 | Japan . |
| 7-211712 | 8/1995 | Japan . |

Primary Examiner—Shrive Beck
Assistant Examiner—Bret Chen
Attorney, Agent, or Firm—Lorusso & Loud

[57] ABSTRACT

In a method for forming a film by thermal CVD, a fluorine-containing silicon oxide film is formed on a substrate by thermal reaction of a mixed gas while heating the substrate. The mixed gas includes an organic silane having a Si-F bond, an organic silane having no Si-F bond, and ozone.

10 Claims, 6 Drawing Sheets

FIG.8

| SOURCE MIXING RATIO (F-TES TO TES) | DEPOSITION TEMPERATURE (°C) | UPPER ELECTRODE (13.56MHz) | LOWER ELECTRODE (100KHz) | TREATMENT CONDITION (FOR EXPOSING TO PLASMA) | RELATIVE DIELECTRIC CONSTANT ($\varepsilon$, 1MHz) | REFRACTIVE INDEX (Nf) |
|---|---|---|---|---|---|---|
| 1:1 | 350 | 400W | 400W | $O_2$ | 3.5~3.7 | 1.414 |
| 1:1 | 300 | 400W | 400W | $O_2$ | 3.8~3.9 | 1.419 |
| 2:1 | 300 | 400W | 400W | $O_2$ | 3.2~3.4 | 1.420 |
| 2:1 | 350 | WITHOUT EXPOSING TO PLASMA | | | >4 | 1.429 |
| 2:1 | 300 | WITHOUT EXPOSING TO PLASMA | | | >4 | 1.420 |
| 1:1 | 350 | 400W | 400W | $N_2$ | 3.8~4.1 | 1.421 |
| 1:1 | 300 | 400W | 400W | $N_2$ | 3.6~4.0 | 1.433 |

(NOTE) TES : Triethoxysilane ($SiH(OC_2H_5)_3$)

METHOD FOR FORMING A FLUORINE CONTAINING SILICON OXIDE FILM

BACKGROUND OF THE INVENTION

1. Field of the Invention

The present invention relates to a film forming method and, more particularly, a film forming method for forming a fluorine-containing silicon oxide film using thermal CVD.

2. Description of the Prior Art

In the prior art, most layers used for semiconductor devices consist of a $SiO_2$ film or $SiO_2$-based film. Such $SiO_2$-based insulating film has a relative dielectric constant of about 4.0 (measured at a frequency of 1 MHz). Thus, a capacitance C between upper and lower conductors sandwiching such an interlayer, and between adjacent conductive layers putting the interlayer insulating film therebetween can be determined. In other words, $$C = \epsilon_0 \cdot \epsilon \cdot A/t$$

Where
$\epsilon_0$: dielectric constant in vacuum (=1),
$\epsilon$: relative dielectric constant of interlayer insulating film,
A: overlapping area of upper and lower interconnection layers or opposing area between adjacent interconnection layers, used for convenience in calculation. However, in actuality, areas of the interconnection layers, other than the overlapping area, also contribute to the capacitance, and
t: film thickness of the interlayer insulating film disposed between the upper and lower interconnection layers, or a space formed between adjacent interconnection layers sandwiching the interlayer insulating film.

Such parasitic capacitance is present in all semiconductor devices. However, if a value of such parasitic capacitance is considerably large, either crosstalk between the interconnection layers would occur or delay would be caused in signal propagation time. In particular, if a multilayered structure is utilized in order to achieve high integration density for the semiconductor device, parasitic capacitance would be increased since overlapping areas or opposing areas between the interconnection layers are increased. Furthermore, since a space between the adjacent interconnection layers is narrowed as dimensions of the patterns are made finer, there are some cases where the space between adjacent interconnection layers become smaller relative to the space between the upper and lower interconnection layers. For this reason, the parasitic capacitance is increased. Therefore influence of the parasitic capacitance on the device characteristics cannot be ignored.

One approach for reducing the parasitic capacitance, is reduction of the relative dielectric constant ($\epsilon$) of the interlayer insulating film. Currently, this approach adopts one of the following techniques:

(1) Use of an organic resin film. Use has been reported of such an interlayer insulating film having a relative dielectric constant of less than $\epsilon=3.0$.

(2) Use of a Teflon-based insulating film. Use of such an interlayer insulating film having a relative dielectric constant of less than $\epsilon=3.0$ has been reported.

(3) Use of an SiBN film or SiOBN film. An example has been reported in which the interlayer insulating film is formed by sputtering.

(4) Use of either an $SiO_2$ film containing Si-F bonds or an $SiO_2$ film containing F.

However, in the cases of (1) and (2), since the interlayer insulating film is formed of a substance which is totally different from $SiO_2$, sufficient reliability and stability of the film cannot be achieved. In addition, evaluation of its application to semiconductor devices has not been reported and, therefore, applicability of such an insulating film is not certain and has not been confirmed in practical use.

In the case of (3), since such an insulating film has high hygroscopicity, it is not suitable for application to semiconductor devices. Moreover, (3) employs a method for forming a BSG film by causing a SiOB source (organic compound having a SiOB bond, for instance, tristrimethylsilylborate) to react with ozone to form the BSG film, which is in the research and development stage.

In the case of (4), the fluorine (F)-containing silicon oxide film may be formed by various techniques providing about a 3.4 to 3.6 value for relative dielectric constant ($\epsilon$), (4) is currently being investigated and developed.

Regardless of which technique is used, it is important to form a fluorine-containing silicon oxide film which is stable in quality.

The prior art has used the following for forming a fluorine-containing silicon oxide film:

(1) Hydrolysis of fluorotriethoxysilane ($SiF(OC_2H_5)_3$), (2) Plasma CVD using triethoxysilane (TEOS), $C_2F_6$, and oxygen ($O_2$), (3) Plasma CVD or ECR plasma CVD method using $SiF_4$ and oxygen ($O_2$), and (4) Plasma CVD using $SiF(OC_2H_5)_3$ and oxygen ($O_2$).

The above methods are all plasma CVD methods except for the method (1). The values $\epsilon=3.4$ to 3.6 for the relative dielectric constant have been achieved by these methods.

However, these prior art fluorine-containing silicon oxide films are prone to absorb moisture, as a result of which their relative dielectric constants are increased. In other words, the silicon oxide films are inferior in water resistance.

In particular, if formed by the plasma CVD method, the silicon oxide films exhibit poor step coverage, so that they are not suitable to be filled into minute spaces. Although the ECR plasma CVD method is the most stable of the various plasma CVD methods, it is not suitable for use in mass production because of its large size equipment. In addition, while $SiF(OC_2H_5)_3$ has an Si-F bond, it is difficult to keep the bond in the plasma as is and, therefore, it is hard to properly control fluorine density.

SUMMARY OF THE INVENTION

It is an object of the present invention to provide a film-forming method capable of forming a fluorine-containing silicon oxide film which is superior in step coverage, which has a small relative dielectric constant, and which has stable film quality.

In the present invention, an organic silane having a Si-F bond is used as a source gas. This source gas is extremely easy to decompose, and thus hydrolysis and oxidation of the source gas can occur at room temperature. In order to suppress such decomposition, an organic silane having no Si-F bond is added to the source gas in proper quantity. The fluorine-containing silicon oxide film is formed by reaction of the source gas with ozone while a substrate is being heated. It is preferable that the substrate temperature be held in the range of 300° to 400° C. to achieve a proper deposition rate and to produce a good quality silicon oxide film.

In the fluorine-containing silicon oxide film formed as described above, the relative dielectric constant can be controlled according to the amount of contained fluorine. As a rule, the greater the amount of contained fluorine, the lower the relative dielectric constant. Since the fluorine-containing silicon oxide film is formed by a thermal CVD method, it is superior in step coverage.

Furthermore, with the use of a reforming process for exposing the fluorine—containing silicon oxide film to oxygen or nitrogen plasma, moisture contained in the film can be removed to thus lower the relative dielectric constant much more. In addition, denseness of the silicon oxide film can be increased by the plasma irradiation process to increase water resistance of the silicon oxide film. Consequently, variation in the relative dielectric constant with elapsed time can be suppressed and therefore a low relative dielectric constant can be maintained.

BRIEF DESCRIPTION OF THE DRAWINGS

FIG. 8 is a table of experimental test parameters and results illustrating quality improvement due to plasma irradiation of the fluorine-containing silicon oxide film formed by the film forming method according to the present invention.

DESCRIPTION OF THE PREFERRED EMBODIMENT

Figure 1:
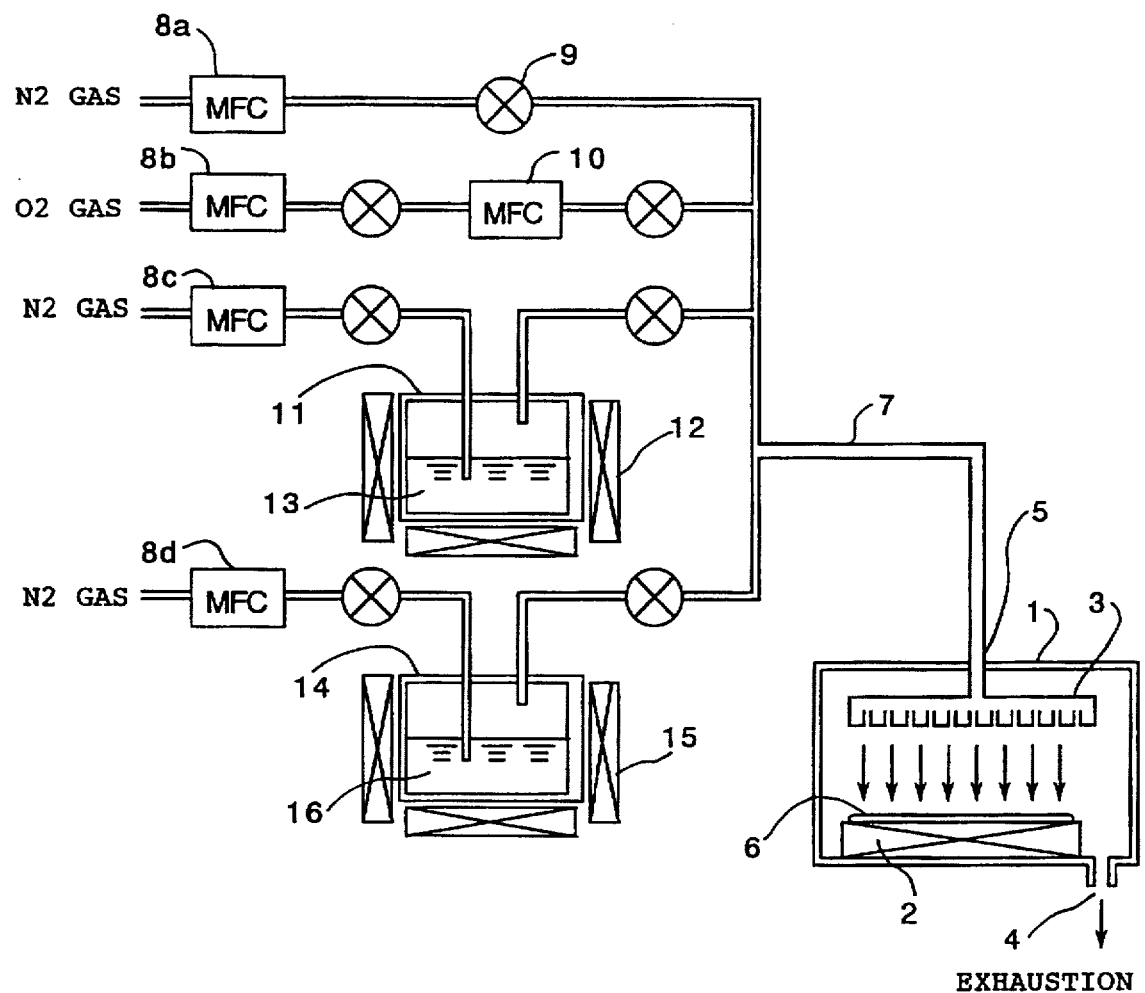
FIG. 1 is a schematic view showing a film forming apparatus for use in formation of a fluorine-containing silicon oxide film according to an embodiment of the present invention.

A film forming system which is used to form a fluorine-containing silicon oxide film according to an embodiment of the present invention is shown in FIG. 1 as including a reaction gas supplying section and a film forming section.

As shown in FIG. 1, the apparatus includes a wafer loading table 2 having a built-in heater, a gas discharging portion 3 and a film forming chamber 1. An exhaust port 4 and a gas introducing port 5 are provided in the film forming chamber 1. Reaction gas is introduced from the gas introducing port 5 into the film forming chamber 1 via a pipe 7 while unused reaction gas is exhausted from the exhaust port 4 to the exterior of the film forming chamber 1. Mixed reaction gas is supplied to the pipe 7 from the reaction gas supplying section. The reaction gas supplying section includes a plurality of branch pipes which are connected to respective gas sources. In this embodiment of the present invention, the branch pipes comprise a first branch pipe for supplying nitrogen gas, a second branch pipe for supplying ozone ($O_3$) containing gas, a third branch pipe for supplying an organic silane with a Si-F bond, e.g., fluorotriethoxysilane (F-TES), and a fourth branch pipe for supplying an organic silane without a Si-F bond, e.g., tetraethoxysilane (TEOS).

The first branch pipe is provided with a port for introducing nitrogen gas, a mass flow controller (MFC) 8a, and a switching valve 9 which may cut off/introduce gas flow. The second branch pipe is provided, intermediate a port for introducing oxygen gas and the pipe 7, with a mass flow controller (MFC) 8b, an ozone generating unit 10, and switching valves 9 which may cut off/introduce gas flow. The ozone generating unit 10 converts oxygen gas into ozone in proper quantity so as to adjust the ozone content in an oxygen-containing gas.

The third branch pipe is provided with a port introducing a carrier gas (nitrogen gas), a mass flow controller (MFC) 8c, a container 11 containing FTES solution 13, a heater 12 for heating the FTES solution 13, and switching valves 9 which may cut off/introduce gas flow. Nitrogen gas containing F-TES is obtained by bubbling of the carrier gas (nitrogen gas) through the F-TES solution and is supplied to the pipe 7.

In the middle of the fourth branch pipe, between a port for introducing carrier gas (nitrogen gas) and the pipe 7, are interposed a mass flow controller (MFC) 8d, a container 14 containing a TEOS solution 16, a heater 15 for heating the TEOS solution 16, and switching valves 9 which may cut off/introduce gas flow. Nitrogen gas containing TEOS is obtained by bubbling the carrier gas (nitrogen gas) through the TEOS solution 16 and is supplied to the pipe 7.

In forming the fluorine-containing silicon oxide film using atmospheric pressure CVD, first a wafer 6 is placed on the wafer loading table 2 positioned at the bottom of the film forming chamber 1 and is then heated. For purposes of experimentation, the temperature of the wafer 6 was varied film by film within the range of 100° to 350° C. In turn, the F-TES solution 13 is heated and then held at the temperature of 40° C. At the same time, the TEOS solution 16 is heated and then held at the temperature of 65° C.

Next, all switching valves 9 provided on respective branch pipes are opened. More particularly, nitrogen gas is supplied at a flow rate of 18 SLM to the pipe 7 via the first branch pipe, oxygen gas including 2.4% ozone is supplied at a flow rate of 7.5 SLM to the pipe 7 via the second branch pipe, nitrogen gas including F-TES is supplied to the pipe 7 via the third branch pipe, and nitrogen gas including TEOS is supplied at a flow rate of 2.0 SLM to the pipe 7 via the fourth branch pipe. These gases are then mixed and supplied to the film forming chamber 1. For purposes of experiment, the flow rate of the nitrogen gas containing F-TES was varied within the range of 0.5 to 3.0 SLM.

Mixed gas is discharged toward the wafer 6 from the gas discharging portion 3 in the film forming chamber 1 to start the film forming process. While holding conditions steady for a predetermined time, the fluorine-containing silicon oxide film is formed on the wafer 6 to a predetermined thickness.

Figure 3:
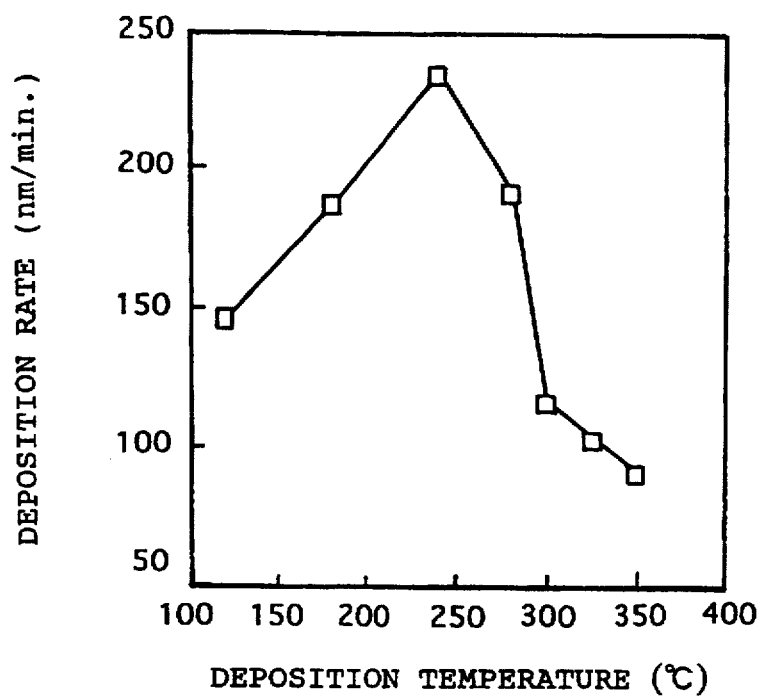
FIG. 3 is a graph of deposition rate versus deposition temperature for the fluorine-containing silicon oxide film formed according to the present invention.

FIG. 3 shows correlation of the deposition rate with the deposition temperature. The ordinate represents the deposition rate (nm/min) in linear scale while the abscissa represents the deposition temperature (C) in linear scale. The flow rate of F-TES is kept constant at 2.0 SLM. As shown in FIG. 3, the deposition rate reaches its maximum value of about 250 nm/min at a temperature of almost 250° C.

Figure 5:
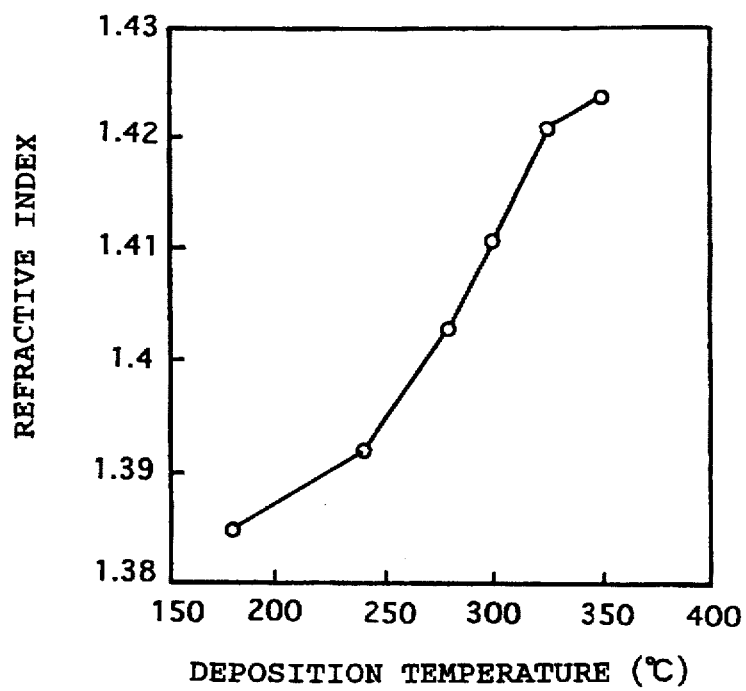
FIG. 5 is a graph of refractive index versus deposition temperature in forming of the fluorine-containing silicon oxide film by the method the present invention.

FIG. 5 shows the relationship between the refractive index of the fluorine-containing silicon oxide film and the deposition temperature. The ordinate represents the refractive index in linear scale while the abscissa represents the deposition temperature (° C.) in linear scale. The flow rate of F-TES is maintained constant at 2.0 SLM.

As shown in FIG. 5, the refractive index is about 1.385 at a deposition temperature of 180° C. The refractive index increases linearly with increase in the deposition temperature. Finally, the refractive index becomes about 1.425 at a substrate temperature of 350° C.

With this change of the refractive index, it can be understood that fluorine becomes more difficult to introduce into the film as the deposition temperature is increased. In other words, the lower the deposition temperature, the smaller the refractive index.

Figure 4:
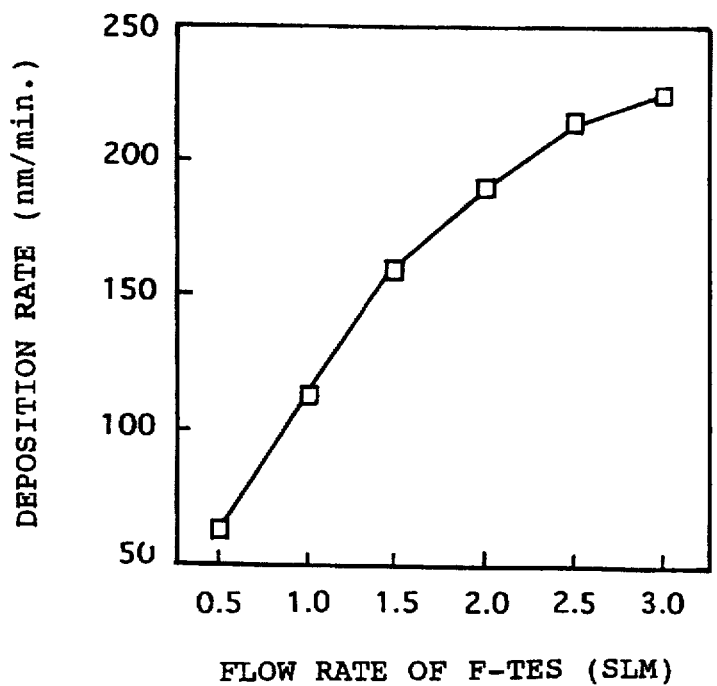
FIG. 4 is a graph of deposition rate versus flow rate for F-TES according to the present invention.

The relationship between the flow rate of F-TES and the deposition rate is shown in FIG. 4. The ordinate represents the deposition rate (nm/min) in linear scale while the abscissa represents the flow rate of F-TES (SLM) in linear scale. The substrate temperature is held constant at 280° C.

As shown in FIG. 4, the deposition rate increases linearly with increase in flow rate of F-TES, and the deposition rate reaches about 230 nm/min at a flow rate of F-TES of 3.0 SLM.

Figure 6:
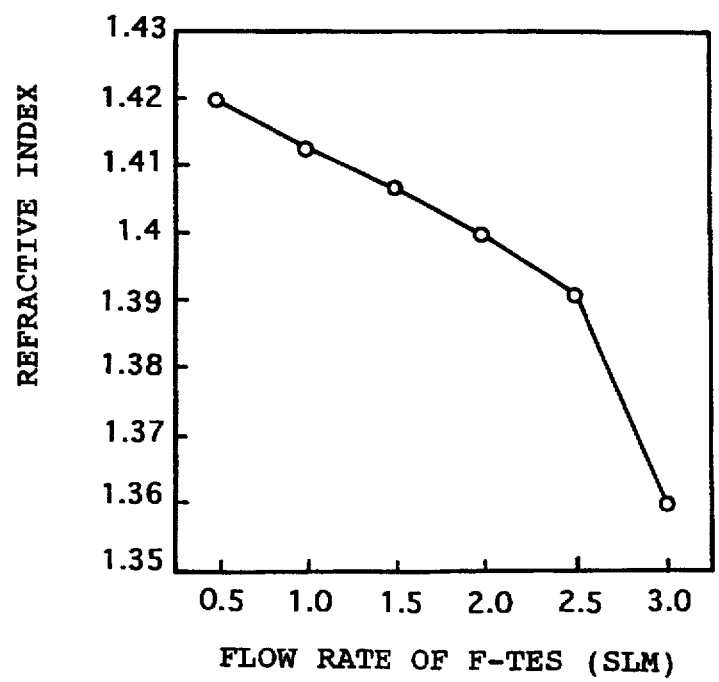
FIG. 6 is a graph of refractive index versus flow rate of F-TES in forming a fluorine-containing silicon oxide film by the method according to an embodiment of the present invention.

FIG. 6 shows a relationship between the refractive index of the fluorine—containing silicon oxide film and the flow rate of F-TES. The ordinate represents the refractive index in linear scale while the abscissa represents the flow rate of F-TES (SLM) in linear scale. The substrate temperature is kept constant at 280° C.

As shown in FIG. 6, a refractive index of about 1.42 is obtained with a flow rate of F-TES of 0.5 SLM. The refractive index then decreases gradually with increase in the flow rate of F-TES. Finally the refractive index becomes about 1.36 at a flow rate of F-TES of 3.0 SLM. It can be appreciated from the above that fluorine is easily introduced in the film as the flow rate of F-TES is increased. In other words, the higher the flow rate of F-TES, the smaller the refractive index.

For the fluorine-containing silicon oxide film formed as described above, the relative dielectric constant can be controlled with respect to the amount of contained fluorine. In general, the greater the amount of contained fluorine, the lower the relative dielectric constant. Since the fluorine-containing silicon oxide film is formed by thermal CVD, it is superior in step coverage.

Figure 2:
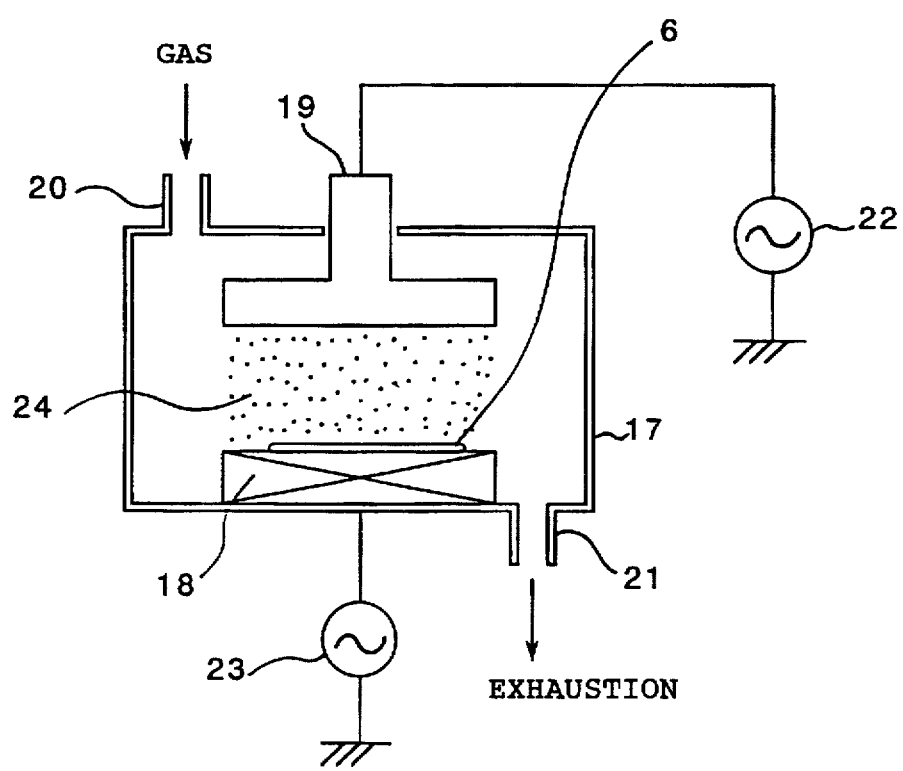
FIG. 2 is a schematic view showing a plasma processing apparatus for use in plasma processing of the fluorine-containing silicon oxide film according to the present invention.

Then, after the film is formed, a plasma treatment is carried out by use of the plasma processing apparatus shown in FIG. 2.

As shown in FIG. 2, the wafer 6 on which the fluorine-containing silicon oxide film is to be formed is placed on the wafer loading table 18 of the plasma processing apparatus. The wafer 6 is then heated and thereafter maintained at 370° C. The inside of a chamber 17 is then evacuated to lower the pressure. After the pressure in the chamber 17 reaches a predetermined low level, gas is introduced from the gas introducing port 20 into the chamber 17. Using oxygen ($O_2$) and nitrogen ($N_2$), respectively, as the gas for the sake of experiment, the results obtained are compared with each other.

Next, electric power of 400 W at a frequency of 13.56 MHz is applied from a power source 22 to an upper electrode 19, and at the same time electric power of 400 W at a frequency of 100 kHz is applied from a power source 23 to a lower electrode 18. Consequently, the gas is converted to a plasma and the wafer 6 is negatively biased, so that the fluorine-containing silicon oxide film formed on the wafer 6 is subjected to irradiation by plasma 24. After about 300 sec has elapsed, plasma irradiation is stopped and then the wafer 6 is taken out of the chamber 17.

Figure 7:
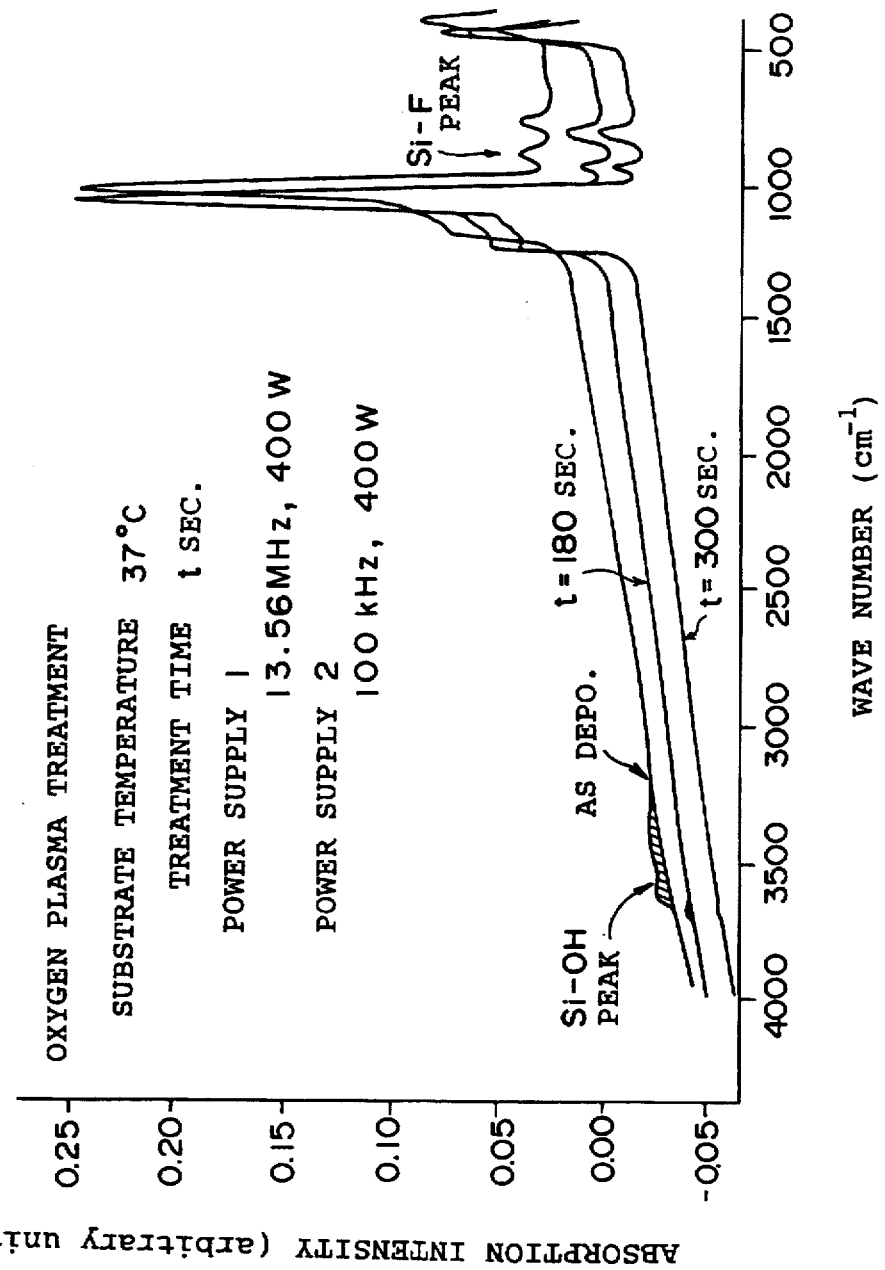
FIG. 7 is a graph illustrating infrared absorption in the fluorine-containing silicon oxide film formed by the method of the present invention, after having been subjected to plasma irradiation.

Then, the infrared absorption characteristics after plasma irradiation are determined as shown in FIG. 7. The ordinate represents the absorption intensity in arbitrary units while abscissa represents the wave number ($cm^{-1}$) in linear scale. Three types of measurements, i.e., immediately after film formation, 180 seconds after plasma irradiation, and 300 seconds after, are compared with each other in FIG. 7.

In FIG. 7, although a Si-OH peak remains immediately after film formation, it is reduced by plasma irradiation for 180 sec and disappears completely after plasma irradiation for 300 sec. This means that moisture which is included in the fluorine-containing silicon oxide film immediately after film formation can be removed by plasma irradiation. In addition, since denseness of the silicon oxide film can be increased by plasma irradiation, water resistance of the silicon oxide film can be improved. As a result, variation in the relative dielectric constant with lapse of time can be suppressed and therefore a low relative dielectric constant can be maintained.

The reforming effect of plasma irradiation of the fluorine-containing silicon oxide film is seen in the data of the table of FIG. 8. Triethoxysilane (TES) was used as the organic silane containing no fluorine.

As shown in FIG. 8, the relative dielectric constant $\epsilon$ obtained after plasma irradiation can be lowered by increasing the ratio of the organic silane containing fluorine to the organic silane containing no fluorine from 3.2 to 3.4. Even if the mixing ratio is so increased, the silicon oxide film still has a large relative dielectric constant $\epsilon$ unless the plasma irradiation is carried out. In the plasma process, use of oxygen gas is more advantageous in providing a small relative dielectric constant as compared to use of nitrogen gas.

From the above, it can be appreciated that the relative dielectric constant may be lowered by included fluorine and may be further enhanced by plasma treatment carried out after film formation.

In the above embodiment, fluorotriethoxysilane (F-TES), which is a fluoroalkoxysilane, has been used as the organic silane having a Si-F bond. However, other fluoroalkoxysilanes ($SiF_n(OR)_{4-n}$, wherein n=1 to 3, R is an alkyl group, an aryl group, or a derivative thereof), fluoroalkylsilanes ($SiF_nR_{4-n}$, wherein n=1 to 3, R is an alkyl group, an aryl group, or a derivative thereof), chain fluorosiloxanes ($R_nF_{3-n}SiO(R_kF_{2-k}SiO)_mSiF_{3-n}R_n$, wherein n=1 to 2, k=0 to 2, m≧0, R is an alkyl group, an aryl group, or a derivative thereof), and ring fluorosiloxanes ($(R_kF_{2-k}SiO)_m$, wherein k=1, m≧2, R is an alkyl group, an aryl group, or a derivative thereof) may be used as the organic silane having a Si-F bond.

TEOS or TES which is an alkoxysilane has been used in the above embodiment as the organic silane having no Si-F bond. However, other alkoxysilanes of the formula $SiH_n(OR)_{4-n}$, wherein n=1 to 3, R is an alkyl group, an aryl group, or derivative thereof, alkylsilanes of the formula $SiH_nR_{4-n}$, wherein n=1 to 3, R is an alkyl group, an aryl group, or a derivative thereof, chain siloxanes of the formula $(R_nH_{3-n}SiO(R_kH_{2-k}SiO)_mSiH_{3-n}R_n$, wherein n=1, 2, k=0 to 2, m≧0, R is an alkyl group, an aryl group, or a derivative thereof, and ring siloxanes of the formula $(R_kH_{2-k}SiO)_m$, wherein k=1, m≧2, R is an alkyl group, an aryl group, or a derivative thereof, may be used as the organic silane having no Si-F bond.

As has been explained above, according to the film forming method of the present invention, the fluorine containing silicon oxide film is formed by a thermal CVD method using an organic silane having a Si-F bond as a source gas.

The relative dielectric constant of the fluorine-containing silicon oxide film formed as described above can be controlled by adjusting the amount of contained fluorine. In general, the greater the amount of contained fluorine, the lower the relative dielectric constant. Since the fluorine-containing silicon oxide film is formed by thermal CVD, it is superior in step coverage.

Furthermore, reforming by exposing the fluorine-containing silicon oxide film to an oxygen or nitrogen plasma, removes moisture contained in the film. In addition, denseness of the silicon oxide film can be increased by the plasma irradiation process to thus increase water resistance of the silicon oxide film. Thereby, variation in the relative dielectric constant with lapse of time can be suppressed and therefore low relative dielectric constant can be maintained.

What is claimed is:

1. A method for forming a film on a substrate comprising:

providing a mixed gas including an organic silane having a Si-F bond, an organic silane having no Si-F bond and ozone;

contacting said mixed gas with the substrate;

heating the substrate while in contact with said mixed gas to thermally react said mixed gas and to thereby form a fluorine-containing silicon oxide film on the substrate;

discontinuing contact between the substrate and said mixed gas; then contacting said fluorine-containing silicon oxide film with a plasma of at least one of oxygen and nitrogen; and heating said substrate while said fluorine-containing silicon oxide film is in contact with said plasma.

2. A method for forming a film according to claim 1, wherein said fluorine-containing silicon oxide film is formed at atmospheric pressure.

3. A method for forming a film according to claim 1, wherein said organic silane having a Si-F bond is selected from the group consisting of:

fluoroalkoxysilanes of the formula $SiF_n(OR)_{4-n}$, wherein n=1 to 3, R is an alkyl group, an aryl group, or a derivative thereof;

fluoroalkylsilanes of the formula $SiF_nR_{4-n}$, wherein n=1 to 3, R is an alkyl group, an aryl group, or a derivative thereof;

chain fluorosiloxanes of the formula $R_nF_{3-n}SiO(R_kF_{2-k}SiO)_mSiF_{3-n}R_n$, wherein n=1 to 2, k=0 to 2, m≥0, R is an alkyl group, an aryl group, or a derivative thereof; and ring fluorosiloxanes of the formula $(R_kF_{2-k}SiO)_m$, wherein k=1, m≥2, R is an alkyl group, an aryl group, or a derivative thereof.

4. A method for forming a film according to claim 3, wherein said organic silane having no Si-F bond is selected from the group consisting of:

alkoxysilanes of the formula $SiH_n(OR)_{4-n}$, wherein n=1 to 3, R is an alkyl group, an aryl group, or a derivative thereof;

alkylsilanes of the formula $SiH_nR_{4-n}$, wherein n=1 to 3, R is an alkyl group, an aryl group, or a derivative thereof;

chain siloxanes of the formula $R_nH_{3-n}SiO(R_kH_{2-k}SiO)_mSiH_{3-n}R_n$, wherein n=1 to 2, k=0 to 2, m≥0, R is an alkyl group, an aryl group, or a derivative thereof; and ring siloxanes of the formula $(R_kH_{2-k}SiO)_m$, wherein k=1, m≥2, R is an alkyl group, an aryl group, or a derivative thereof.

5. A method for forming a film according to claim 1, wherein said organic silane having no Si-F bond is selected from the group consisting of:

alkoxysilanes of the formula $SiH_n(OR)_{4-n}$, wherein n=1 to 3, R is an alkyl group, an aryl group, or a derivative thereof;

alkylsilanes of the formula $SiH_nR_{4-n}$, wherein n=1 to 3, R is an alkyl group, an aryl group, or a derivative thereof;

chain siloxanes of the formula $R_nH_{3-n}SiO(R_kH_{2-k}SiO)_mSiH_{3-n}R_n$, wherein n=1 to 2, k=0 to 2, m≥0, R is an alkyl group, an aryl group, or a derivative thereof; and ring siloxanes of the formula $(R_kH_{2-k}SiO)_m$, wherein k=1, m≥2, R is an alkyl group, an aryl group, or a derivative thereof.

6. A method for forming a film according to claim 1, wherein said mixed gas additionally includes oxygen.

7. A method for forming a film according to claim 1, wherein said plasma is formed from $O_2$, NO, $NO_2$, or $N_2O$.

8. A method for forming a film according to claim 1 wherein said contacting with a plasma is conducted at a temperature higher than the temperature at which the fluorine-containing silicon oxide film is formed.

9. A method for forming a film according to claim 1, wherein a dielectric constant for said fluorine-containing silicon oxide film is set by adjusting the temperature of said thermal reaction.

10. A method for forming a film according to claim 1, wherein a dielectric constant for said fluorine-containing silicon oxide film is set by adjusting the flow rate of said organic silane having a Si-F bond.

* * * * *

UNITED STATES PATENT AND TRADEMARK OFFICE
CERTIFICATE OF CORRECTION

PATENT NO. : 5,800,877
DATED : September 1, 1998
INVENTOR(S) : MAEDA et al

It is certified that error appears in the above-indentified patent and that said Letters Patent is hereby corrected as shown below:

On title page, item [30]

Under the heading "Foreign Application Priority Data", "1996" should read --1995--.

Signed and Sealed this

Tenth Day of August, 1999

Attest:

Attesting Officer

Q. TODD DICKINSON

Acting Commissioner of Patents and Trademarks